United States Patent
Iriyama et al.

(10) Patent No.: US 9,018,916 B2
(45) Date of Patent: Apr. 28, 2015

(54) LITHIUM SECONDARY BATTERY AND CONTROL SYSTEM THEREFOR, AND METHOD FOR DETECTING STATE OF LITHIUM SECONDARY BATTERY

(75) Inventors: Jiro Iriyama, Tokyo (JP); Tetsuya Kajita, Tokyo (JP); Daisuke Kawasaki, Tokyo (JP); Ryuichi Kasahara, Tokyo (JP); Tatsuji Numata, Tokyo (JP)

(73) Assignees: NEC Corporation, Tokyo (JP); NEC Energy Devices, Ltd., Kanagawa (JP)

( * ) Notice: Subject to any disclaimer, the term of this patent is extended or adjusted under 35 U.S.C. 154(b) by 281 days.

(21) Appl. No.: 13/811,837

(22) PCT Filed: Jul. 20, 2011

(86) PCT No.: PCT/JP2011/066442
§ 371 (c)(1),
(2), (4) Date: Jan. 23, 2013

(87) PCT Pub. No.: WO2012/017824
PCT Pub. Date: Feb. 9, 2012

(65) Prior Publication Data
US 2013/0119940 A1    May 16, 2013

(30) Foreign Application Priority Data

Aug. 4, 2010 (JP) .................................. 2010-175337
Dec. 24, 2010 (JP) .................................. 2010-287956

(51) Int. Cl.
*H02H 3/24* (2006.01)
*G01R 31/36* (2006.01)
(Continued)

(52) U.S. Cl.
CPC ............ *G01R 31/362* (2013.01); *H01M 4/485* (2013.01); *H01M 10/44* (2013.01); *H01M 10/48* (2013.01); *G06F 17/15* (2013.01); *H02J 7/00* (2013.01); *Y02E 60/122* (2013.01)

(58) Field of Classification Search
USPC .............................. 320/132, 134, 136; 702/63
See application file for complete search history.

(56) References Cited

U.S. PATENT DOCUMENTS 5,429,890 A * 7/1995 Pynenburg et al. ............ 429/310
8,563,169 B2 * 10/2013 Liu et al. ......................... 429/209
(Continued)

FOREIGN PATENT DOCUMENTS

CN    101048897 A    10/2007
CN    101383438 A    3/2009
(Continued)

OTHER PUBLICATIONS

Kazuma Kumai, et al., "Degradation Mechanism of Li-ion Cell after Long Cycling—Mechanism and Method for Estimating the Degradation Factor-", CRIEPE Research Report, Apr. 2001, pp. 1-17, Komae Research Lab. Rep. No. T01033.

(Continued)

*Primary Examiner* — Naum B Levin
(74) *Attorney, Agent, or Firm* — Sughrue Mion, PLLC

(57) ABSTRACT

There is provided a control system for a lithium secondary battery that can quantitatively sense a deterioration state inherent in a lithium secondary battery using silicon oxide as a negative electrode active material, that is, the nonuniform reaction state of a negative electrode. A control system for a lithium secondary battery including a positive electrode, a negative electrode using silicon oxide as a negative electrode active material, and a lithium reference electrode having a reference potential with respect to the negative electrode includes measurement means for measuring a voltage V of the negative electrode with respect to the lithium reference electrode and a discharge capacity Q of the lithium secondary battery during discharge of the lithium secondary battery; generation means for generating a V-dQ/dV curve representing a relationship between dQ/dV, which is a proportion of an amount of change dQ in the discharge capacity Q to an amount of change dV in the voltage V, and the voltage V; calculation means for calculating an intensity ratio of two peaks appearing on the V-dQ/dV curve for two voltage values in the voltage V; and sensing means for sensing a state of the negative electrode utilizing the intensity ratio.

20 Claims, 5 Drawing Sheets

(51) Int. Cl.
*H01M 4/485* (2010.01)
*H01M 10/44* (2006.01)
*H01M 10/48* (2006.01)
*G06F 17/15* (2006.01)
*H02J 7/00* (2006.01)

(56) References Cited

U.S. PATENT DOCUMENTS

| | | | |
|---|---|---|---|
| 8,653,793 B2* | 2/2014 | Ueki et al. | 320/132 |
| 2009/0226797 A1* | 9/2009 | Yoshitake et al. | 429/50 |
| 2011/0012604 A1 | 1/2011 | Tsujiko et al. | |
| 2014/0076729 A1* | 3/2014 | Iriyama et al. | 205/50 |

FOREIGN PATENT DOCUMENTS

| | | |
|---|---|---|
| CN | 101479911 A | 7/2009 |
| JP | 7-294611 A | 11/1995 |
| JP | 11-346444 A | 12/1999 |
| JP | 2997741 B2 | 1/2000 |
| JP | 2007-292778 A | 11/2007 |
| JP | 2009-080093 A | 4/2009 |
| JP | 2009-252381 A | 10/2009 |

OTHER PUBLICATIONS

George Ting-Kuo Fey, et al., "Electrochemical studies on surface coated $LiCoVO_4$ with $Al_2O_3$ derived from carboxylate-alumoxane for lithium-ion cells", Journal of Power Sources, 2007, pp. 1152-1155, vol. 174.

Ira Bloom, et al., "Differential voltage analyses of high-power lithium-ion cells 3. Another anode phenomenon", Journal of Power Sources, 2006, pp. 537-542, vol. 157.

Communication dated Sep. 2, 2014, issued by the State Intellectual Property Office of the People's Republic of China in corresponding Application No. 201180038349.9.

* cited by examiner

LITHIUM SECONDARY BATTERY AND CONTROL SYSTEM THEREFOR, AND METHOD FOR DETECTING STATE OF LITHIUM SECONDARY BATTERY

CROSS REFERENCE TO RELATED APPLICATIONS

This application is a National Stage of International Application No. PCT/JP2011/066442 filed Jul. 20, 2011, claiming priority based on Japanese Patent Application Nos. 2010-175337, filed Aug. 4, 2010 and 2010-287956, filed Dec. 24, 2010, the contents of all of which are incorporated herein by reference in their entirety.

TECHNICAL FIELD

This exemplary embodiment relates to a lithium secondary battery including a negative electrode using silicon oxide as a negative electrode active material, and a control system therefor, and a method for detecting the state of a lithium secondary battery.

BACKGROUND ART

As a system that detects the state of a secondary battery and controls the state, various ones have been proposed so far. Patent Literatures 1 to 3 disclose systems that sense the state of charge (the amount of storage or SOC) of a secondary battery based on the battery voltage of the secondary battery. Patent Literature 4 discloses a system that includes dV/dQ calculation means for calculating the value of dV/dQ, which is the proportion of the amount of change dV in the battery voltage V of a secondary battery to the amount of change dQ in the amount of storage Q, and senses the state of a secondary battery system utilizing a characteristic point appearing on a Q-dV/dQ curve representing the relationship between the value of the amount of storage Q and the value of dV/dQ, or a characteristic point appearing on a V-dV/dQ curve representing the relationship between the value of the battery voltage V and the value of dV/dQ.

On the other hand, Patent Literature 5 discloses a lithium secondary battery including a negative electrode using silicon oxide as a negative electrode active material.

CITATION LIST

Patent Literature

Patent Literature 1: JP2007-292778A
Patent Literature 2: JP11-346444A
Patent Literature 3: JP7-294611A
Patent Literature 4: JP2009-252381A
Patent Literature 5: JP2997741B

SUMMARY OF INVENTION

Technical Problem

The lithium secondary battery disclosed in Patent Literature 5, that is, the lithium secondary battery including a negative electrode using silicon oxide as a negative electrode active material, has the property that the lithium ion conductivity of the silicon oxide used for the negative electrode increases as the amount of doped lithium increases. Therefore, a problem is that the amount of lithium doping accompanying charge and discharge is likely to be locally unbalanced in the negative electrode. When charge and discharge are repeated with the amount of lithium doping locally unbalanced in the negative electrode, volume change accompanying charge and discharge increases only in parts in which the amount of lithium doping is larger than that of other parts in the negative electrode, and therefore, finally, the parts may peel off the current collector to decrease battery capacity. Therefore, in the lithium secondary battery using silicon oxide as the negative electrode active material, it is necessary to quantitatively sense its inherent deterioration state, that is, the nonuniform reaction state of the negative electrode.

But, in the techniques disclosed in Patent Literatures 1 to 3, the deterioration state of the secondary battery (a decrease in battery capacity or an increase in internal resistance) can be sensed, but in these techniques, information regarding local reaction unbalance within the negative electrode cannot be obtained because the deterioration state is determined by measuring battery voltage. In addition, in the technique disclosed in Patent Literature 4, the point in the amount of electricity at which phase transition accompanied by a minute change in the voltage of the electrode active material occurs can be determined, but the ratio of respective phases at the completion of charge cannot be quantitatively estimated. Therefore, a problem is that it is not possible to quantitatively sense the nonuniform reaction state of the negative electrode of the lithium secondary battery using silicon oxide as the negative electrode active material, that is, sense in what proportion parts in which the lithium concentration is high and parts in which the lithium concentration is low are present.

This exemplary embodiment provides a control system for a lithium secondary battery that can solve the above-described problems.

Solution to Problem

A control system for a lithium secondary battery according to this exemplary embodiment is a control system for a lithium secondary battery including a positive electrode, a negative electrode using silicon oxide as a negative electrode active material, and means for obtaining a potential of the negative electrode with respect to a lithium reference electrode, the control system including measurement means for measuring a voltage V of the negative electrode with respect to the lithium reference electrode and a discharge capacity Q of the lithium secondary battery during discharge of the lithium secondary battery; generation means for generating a V-dQ/dV curve representing a relationship between dQ/dV, which is a proportion of an amount of change dQ in the discharge capacity Q to an amount of change dV in the voltage V, and the voltage V; calculation means for calculating an intensity ratio of two peaks appearing on the V-dQ/dV curve for two voltage values in the voltage V; and sensing means for sensing a state of the negative electrode utilizing the intensity ratio.

A lithium secondary battery according to this exemplary embodiment is a lithium secondary battery including a positive electrode, a negative electrode using silicon oxide as a negative electrode active material, and a lithium reference electrode having a reference potential with respect to the negative electrode, including a charge and discharge control portion for repeatedly charging and discharging the lithium secondary battery; a measurement portion for measuring a voltage V of the negative electrode with respect to the lithium reference electrode and a discharge capacity Q of the lithium secondary battery during discharge of the lithium secondary battery; a generation portion for generating a V-dQ/dV curve representing a relationship between dQ/dV, which is a proportion of an amount of change dQ in the discharge capacity Q to an amount of change dV in the voltage V, and the voltage V; a peak intensity ratio calculation portion for calculating an intensity ratio of two peaks appearing on the V-dQ/dV curve for two voltage values in the voltage V; a peak intensity ratio sensing portion for sensing a state of the negative electrode utilizing the intensity ratio; and an information transmission portion for transmitting, when the sensing portion senses that a difference between the intensity ratio of the two peaks appearing on the V-dQ/dV curve for the two voltage values in the voltage V becomes equal to or more than a predetermined threshold, the information to the charge and discharge control portion, wherein the charge and discharge control portion receiving the transmission executes means for improving a degree of uniformity of lithium concentration in the negative electrode.

A method for detecting a state of a lithium secondary battery according to this exemplary embodiment is a method for detecting a state of a lithium secondary battery including a positive electrode, a negative electrode using silicon oxide as a negative electrode active material, and a lithium reference electrode having a reference potential with respect to the negative electrode, including a measurement step of measuring a voltage V of the negative electrode with respect to the lithium reference electrode and a discharge capacity Q of the lithium secondary battery during discharge of the lithium secondary battery; a generation step of generating a V-dQ/dV curve representing a relationship between dQ/dV, which is a proportion of an amount of change dQ in the discharge capacity Q to an amount of change dV in the voltage V, and the voltage V; a calculation step of calculating an intensity ratio of two peaks appearing on the V-dQ/dV curve for two voltage values in the voltage V; and a sensing step of sensing a state of the negative electrode utilizing the intensity ratio.

Advantageous Effect of Invention

According to this exemplary embodiment, it is possible to quantitatively sense a deterioration state inherent in a lithium secondary battery using silicon oxide as a negative electrode active material, that is, the nonuniform reaction state of a negative electrode.

DESCRIPTION OF EMBODIMENTS

[First Exemplary Embodiment]

A first exemplary embodiment will be described below with reference to the drawings.

Figure 5:
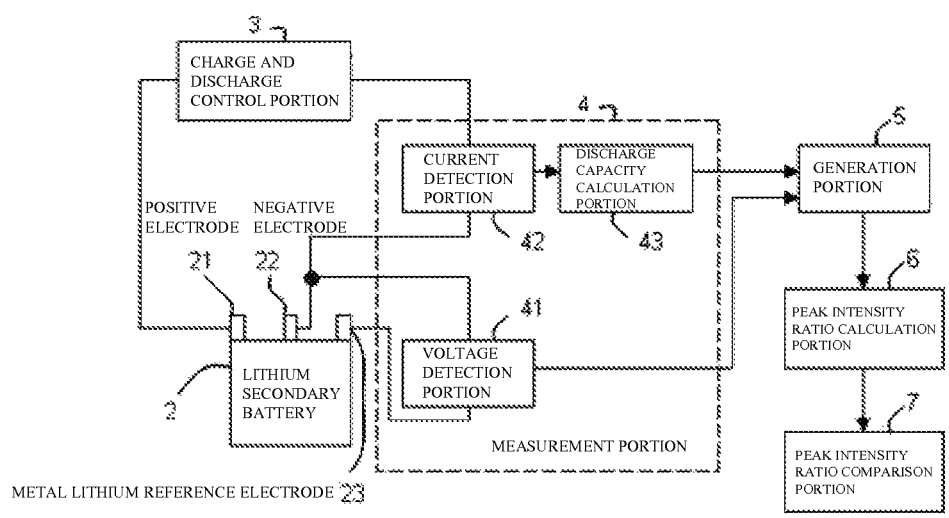
FIG. 5 is a diagram showing a control system for a lithium secondary battery according to a first exemplary embodiment.

FIG. 5 is a block diagram showing a control system for a lithium secondary battery according to the first exemplary embodiment.

In FIG. 5, a control system for a lithium secondary battery 1 includes a lithium secondary battery 2, a charge and discharge control portion 3, a measurement portion 4, a generation portion 5, a peak intensity ratio calculation portion 6, and a peak intensity ratio comparison portion 7. In the control system for a lithium secondary battery 1 according to the first exemplary embodiment, the measurement portion 4, the generation portion 5, the peak intensity ratio calculation portion 6, and the peak intensity ratio comparison portion 7 are essential structures, and the lithium secondary battery 2 and the charge and discharge control portion 3 are optional structures.

The lithium secondary battery 2 includes a positive electrode 21, a negative electrode 22, and a metal lithium reference electrode 23. For the negative electrode 22, silicon oxide is used as a negative electrode active material. The metal lithium reference electrode 23 is one of means for obtaining the potential of the negative electrode 22 with respect to lithium.

As the negative electrode active material of the negative electrode 22, silicon oxide described in Patent Literature 5 can be used. Examples of silicon oxide include $SiO_y(0<y<2)$, $SiLi_xO_y(x>0$ and $2>y>0)$, silicates, and compounds in which slight amounts of metal elements or nonmetal elements are added to these silicon oxides. In addition, these silicon oxides may be crystalline or amorphous. Only one of these may be used, or two or more of these may be used in combination.

For all structures other than the negative electrode 22, for example, the positive electrode 21, the electrolytic solution, and the separator, of the structures of the lithium secondary battery 2, those used in publicly known lithium secondary batteries can be used.

Examples of the positive electrode active material of the positive electrode 21 include lithium manganate having a layered structure or lithium manganate having a spinel structure, such as $LiMnO_2$ or $Li_xMn_2O_4$ $(0<x<2)$, $LiCoO_2$, $LiNiO_2$, or compounds in which some of these transition metals are replaced by other metals. In addition, $LiFePO_4$ having an olivine type crystal structure can also be used. One of these positive electrode active materials can be used alone, or two or more of these positive electrode active materials can be used in combination.

The electrolytic solution material is not particularly limited as long as it is stable at the redox potential of metal lithium, and publicly known nonaqueous electrolytic solutions can be used. An electrolytic solution in which an electrolyte salt is dissolved in a solvent is most preferred.

As the solvent, those in which two or more of cyclic carbonates, such as propylene carbonate, ethylene carbonate, butylene carbonate, and vinylene carbonate, chain carbonates, such as dimethyl carbonate, diethyl carbonate, ethyl methyl carbonate, and dipropyl carbonate, and lactones, such as γ-butyrolactone, are mixed are preferred for the reason that they are stable at the redox potential of metal lithium.

Examples of the electrolyte salt include lithium salts, such as $LiPF_6$, $LiAsF_6$, $LiAlCl_4$, $LiClO_4$, $LiBF_4$, $LiSbF_6$, $LiCF_3SO_3$, $LiCF_3CO_2$, $Li(CF_3SO_2)_2$, and $LiN(CF_3SO_2)_2$. Only one of these electrolyte salts can be used, or two or more of these electrolyte salts can be used. As other electrolytic solutions, ionic liquids, such as quaternary ammonium-imide salts, can be used.

In addition, not only liquid electrolytic solutions, but also gel electrolytes in which polymers, such as polyacrylonitrile and polyacrylate, are impregnated with the above electrolytic solutions, and solid electrolytes, such as LiPON, $Li_2S$—$LiP_xO_y$ (x=1 to 2 and y=2 to 4), can also be used.

The separator is not particularly limited, and those publicly known can be used. As the separator, porous films and nonwoven fabrics of polypropylene, polyethylene, or the like can be used.

Here, the characteristics of the lithium secondary battery 2 in which silicon oxide is used as the negative electrode active material of the negative electrode 22 will be described.

The present inventors have found that in the lithium secondary battery 2 including the negative electrode 22 using silicon oxide as the negative electrode active material, when the charge current is sufficiently small (for example, 0.02 C), peaks appear at 300 mV or near 300 mV (approximately 0.3 V) and at 500 mV or near 500 mV (approximately 0.5 V), which are the redox potentials of silicon oxide, on a V-dQ/dV curve representing the relationship between dQ/dV, which is the proportion of the amount of change dQ in the amount of discharge Q of the lithium secondary battery 2 to the amount of change dV in the voltage V of the negative electrode 22 with respect to the metal lithium reference electrode 23 during discharge, and the value of the voltage V of the negative electrode 22 with respect to the metal lithium reference electrode 23, and the intensity ratio of the peaks changes with charge capacity per silicon oxide in the negative electrode 22. Here, 0.02 C means a current with such a magnitude that when the lithium secondary battery 2 is charged with a constant current of 0.02 C, the charge of the lithium secondary battery 2 is completed in 50 hours. In addition, approximately 0.3 V and approximately 0.5 V indicate being in the range of ±10% from 0.3 V and 0.5 V, respectively.

Figure 2:
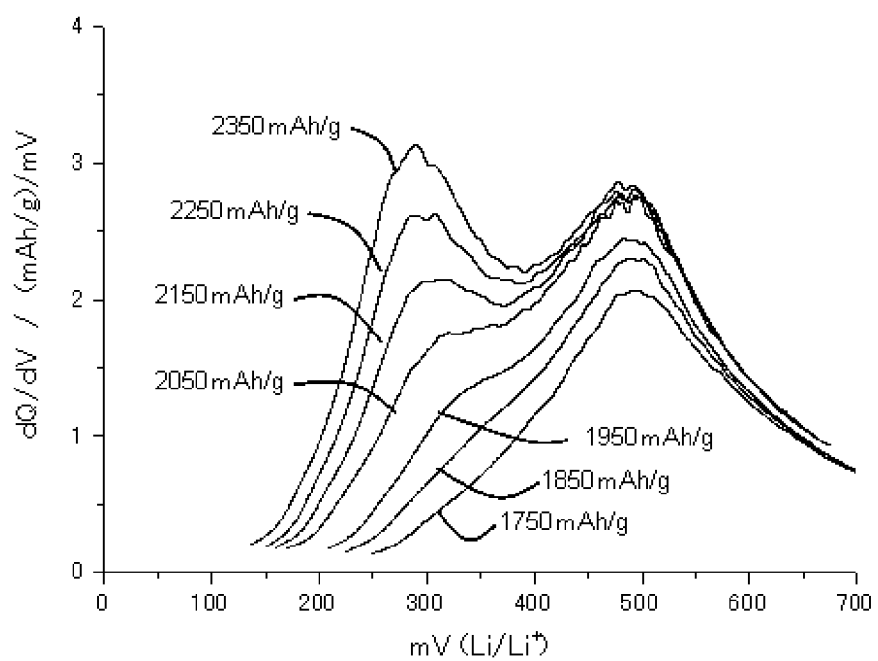
FIG. 2 is a diagram showing V-dQ/dV curves.

FIG. 2 is a diagram showing V-dQ/dV curves during discharge when SiO is used as the silicon oxide. The charge current is 0.02 C.

The present inventors have found that, as shown in FIG. 2, when the charge capacity (the amount of lithium doping) is sufficiently small (for example, when the charge capacity is 1750 mAh/g in FIG. 2), only a peak at approximately 0.5 V appears on the V-dQ/dV curve, and the peak at approximately 0.5 V increases as the charge capacity increases. Further, the present inventors have found that when the charge capacity exceeds a certain value, the peak intensity at approximately 0.5 V is constant, and the second peak appears at approximately 0.3 V on the V-dQ/dV curve, and the peak at approximately 0.3 V increases as the charge capacity increases. This is considered to be because when the amount of lithium doping in the silicon oxide exceeds a certain value, the second phase with different redox potential occurs in the silicon oxide. The amount of lithium contained in the phase having a peak at approximately 0.5 V is smaller than that in the phase having a peak at approximately 0.3 V.

In other words, the present inventors have found that from the intensity ratio of these two peaks, information regarding the proportion of parts in which the lithium content is high to parts in which the lithium content is low in the negative electrode 22 can be obtained.

In a lithium secondary battery including a negative electrode in which silicon oxide is used as a negative electrode active material, the intensity ratio of these two peaks may be different even in the same amount of charge due to differences in various conditions. For example, when a charge and discharge cycle is repeated, the charge and discharge reactions of the negative electrode gradually become nonuniform, and many phases in which the lithium content is high may occur. This is because the lithium ion conductivity of the silicon oxide changes largely depending on the amount of contained lithium, and as the amount of contained lithium increases, the lithium ion conductivity increases. Therefore, a charge reaction is likely to occur in parts in which the amount of contained lithium is large, and as a result, the lithium content in the parts is likely to increase further after charge.

The control system for a lithium ion secondary battery 1 according to this exemplary embodiment quantifies and senses the uniformity of lithium concentration, that is, the uniformity of the state of charge, in the negative electrode 22 of lithium ion secondary battery 2 utilizing the intensity ratio of these peaks. Thus, handling, such as stopping the operation of the lithium secondary battery, can be performed.

The charge and discharge control portion 3 shown in FIG. 5 can generally be referred to as charge and discharge control means. The charge and discharge control portion 3 repeatedly charges and discharges the lithium secondary battery 2.

The measurement portion 4 can generally be referred to as measurement means. The measurement portion 4 measures the voltage V of the negative electrode 22 with respect to the metal lithium reference electrode 23 and the discharge capacity Q of the lithium secondary battery 2 during the discharge of the lithium secondary battery 2. For example, the measurement portion 4 measures the voltage V and the discharge capacity Q during first discharge and during second discharge performed after the first discharge respectively. The measurement portion 4 includes a voltage detection portion 41, a current detection portion 42, and a discharge capacity calculation portion 43.

The voltage detection portion 41 detects the voltage V of the negative electrode 22 with respect to the metal lithium reference electrode 23 during each discharge (at least the first discharge and the second discharge) of the lithium secondary battery 2. The voltage detection portion 41 outputs the value of the voltage V to the generation portion 5.

The current detection portion 42 detects current I flowing from the lithium secondary battery 2 during each discharge (at least the first discharge and the second discharge) of the lithium secondary battery 2. The current detection portion 42 outputs the value of the current I to the discharge capacity calculation portion 43.

The discharge capacity calculation portion 43 calculates the discharge capacity Q of the lithium secondary battery 2 by adding up the values of the current I every predetermined time T during each discharge of the lithium secondary battery 2. The discharge capacity calculation portion 43 outputs the value of the discharge capacity Q to the generation portion 5.

The generation portion 5 can generally be referred to as generation means. The generation portion 5 generates a V-dQ/dV curve representing the relationship between dQ/dV, which is the proportion of the amount of change dQ in the discharge capacity Q to the amount of change dV in the voltage V, and the voltage V. For example, the generation portion 5 generates a V-dQ/dV curve, each time the voltage V and the discharge capacity Q are measured, based on the measured voltage V and discharge capacity Q. The generation portion 5 outputs the V-dQ/dV curve to the peak intensity ratio calculation portion 6.

The peak intensity ratio calculation portion 6 can generally be referred to as calculation means. The peak intensity ratio calculation portion 6 calculates the intensity ratio of two peaks appearing on the V-dQ/dV curve for two voltage values in the voltage V. For example, the peak intensity ratio calculation portion 6 calculates, each time a V-dQ/dV curve is generated, the intensity ratio of two peaks appearing on the V-dQ/dV curve for the two voltage values. In this exemplary embodiment, as the two voltage values in the voltage V, 0.3 V and 0.5 V are used. Instead of 0.3 V, a voltage of approximately 0.3 V may be used, and instead of 0.5 V, a voltage of approximately 0.5 V may be used. The peak intensity ratio calculation portion 6 outputs the intensity ratio to the peak intensity ratio comparison portion 7.

The peak intensity ratio comparison portion 7 can generally be referred to as sensing means. The peak intensity ratio comparison portion 7 senses the state of the negative electrode 22 utilizing the intensity ratio. For example, the peak intensity ratio comparison portion 7 compares intensity ratios calculated by the peak intensity ratio calculation portion 6 during a plurality of discharges with each other, and senses the state of the negative electrode 22 from the result of the comparison. As one example, the peak intensity ratio comparison portion 7 senses that the degree of uniformity of lithium concentration in the negative electrode 22 becomes equal to or less than a predetermined value, that is, an unbalance in the amount of lithium doping accompanying charge and discharge occurs in the negative electrode 22 and a nonuniform reaction state in the negative electrode 22 occurs, when the difference between an intensity ratio calculated based on the voltage V and the discharge capacity Q during the second discharge and an intensity ratio calculated based on the above voltage V and discharge capacity Q during the first discharge is equal to or more than a predetermined threshold.

Next, operation will be described.

While the charge and discharge control portion 3 allows the lithium secondary battery 2 to perform discharge operation, the voltage detection portion 41 obtains the voltage V of the negative electrode 22 with respect to the metal lithium reference electrode 23 by measuring the voltage between the negative electrode 22 and the metal lithium reference electrode 23.

Alternatively, it is also possible that the discharge curve of a half cell comprising a positive electrode and a metal lithium negative electrode is previously measured, and the measurement portion 4 obtains the voltage V of the negative electrode 22 with respect to the metal lithium reference electrode 23 by calculation from the difference between the discharge curve of the lithium secondary battery 2 and the discharge curve of the half cell. Since in a positive electrode of lithium manganate having a spinel structure, $LiCoO_2$, $LiNiO_2$, $LiFePO_4$, or the like currently put to practical use in a lithium secondary battery, charge and discharge reactions proceed uniformly and stably compared with those in a negative electrode of silicon oxide, there is no practical problem even if the discharge curve of the positive electrode is considered to be almost constant at any current value for convenience.

In addition, the current detection portion 42 detects the current I flowing from the lithium secondary battery 2 while the lithium secondary battery 2 performs discharge operation. The discharge capacity calculation portion 43 calculates the discharge capacity Q by adding up the current values I detected by the current detection portion 42, every predetermined time T. The measurement portion 4 obtains the voltage V and the discharge capacity Q by the above methods every predetermined time T during the discharge of the lithium secondary battery 2.

Based on the detection results of the measurement portion 4, the generation portion 5 calculates the amount of change dV in the voltage V and the amount of change dQ in the discharge capacity Q for each predetermined time T, and, based on these, obtains the value of dQ/dV for each predetermined time T. The generation portion 5 draws a V-dQ/dV curve from these values of dQ/dV and the values of the voltage V.

The peak intensity ratio calculation portion 6 obtains the intensities (integrated intensities) of peaks on the V-dQ/dV curve by approximating the peaks on the V-dQ/dV curve by a Gaussian function and integrating them, and calculates the intensity ratio.

The peak intensity comparison portion 7 senses the uniformity of the negative electrode reaction by comparing this intensity ratio with a peak intensity ratio obtained from a V-dQ/dV curve when the lithium secondary battery 2 is charged with sufficiently small current (for example, 0.02 C).

[Second Exemplary Embodiment]

Figure 1:
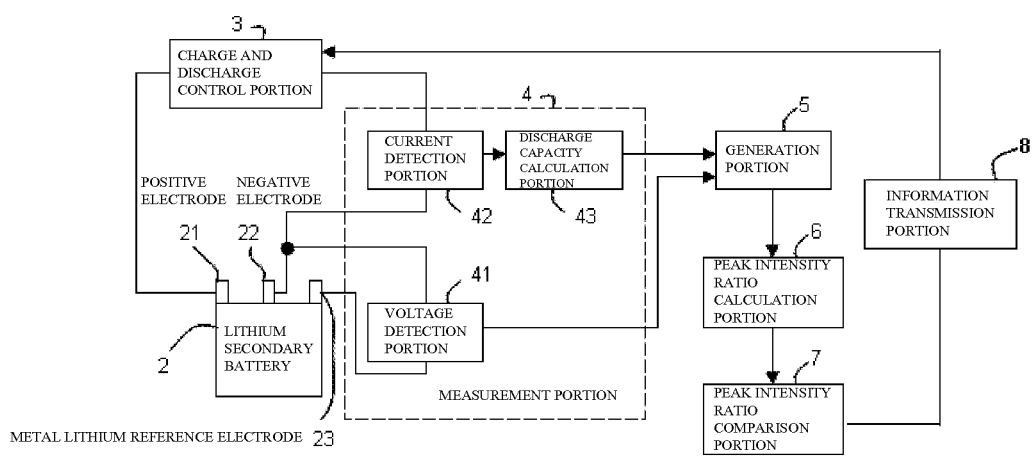
FIG. 1 is a diagram showing a control system for a lithium secondary battery according to a second exemplary embodiment.

A second exemplary embodiment will be described below with reference to FIG. 1.

A control system for a lithium secondary battery 1 according to the second exemplary embodiment includes a lithium secondary battery 2, a charge and discharge control portion 3, a measurement portion 4, a generation portion 5, a peak intensity ratio calculation portion 6, and a peak intensity ratio comparison portion 7, as in the first exemplary embodiment, but is different in further including an information transmission portion 8. In the control system for a lithium secondary battery 1 according to the second exemplary embodiment, the charge and discharge control portion 3, the measurement portion 4, the generation portion 5, the peak intensity ratio calculation portion 6, the peak intensity ratio comparison portion 7, and the information transmission portion 8 are essential structures, and the lithium secondary battery 2 is an optional structure.

The information transmission portion 8 can generally be referred to as information transmission means, and transmits information regarding intensity ratios obtained by the peak intensity ratio comparison portion 7 to the charge and discharge control portion 3.

In the second exemplary embodiment, the peak intensity ratio comparison portion 7 compares a peak intensity ratio in an ideal uniform state with measured peak intensity, and when the difference between both exceeds a certain value (for example, 10% or more, hereinafter referred to as a threshold), the peak intensity ratio comparison portion 7 transmits the information to the charge and discharge control portion through the information transmission portion 8, and executes a regeneration mode (charge or discharge with microcurrent). By performing charge and discharge with microcurrent (for example, 0.02 C), the uniformity of lithium concentration in the negative electrode can be improved.

Figure 3:
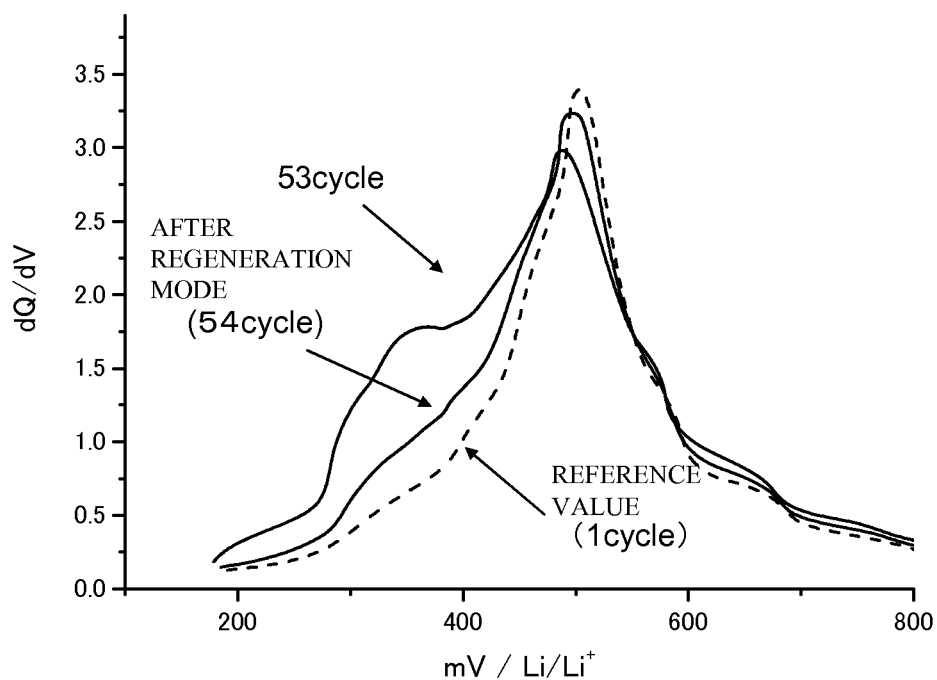
FIG. 3 is a diagram showing V-dQ/dV curves before and after the execution of a regeneration mode.

FIG. 3 is a diagram showing V-dQ/dV curves during discharge when a charge and discharge cycle is repeated in a lithium secondary battery including a negative electrode in which SiO is used as silicon oxide. By repeating the charge and discharge cycle (1 C current), the peak intensity ratio on the V-dQ/dV curve changes, and when a regeneration mode (0.02 C) is executed when the deviation from the reference value of the peak intensity ratio exceeds 10% in the 53th cycle, the deviation from the reference value of the peak intensity ratio returns to within the threshold when the cycle test is resumed after the execution. This indicates that for the nonuniformity of lithium concentration, the uniformity is improved by the execution of the regeneration mode.

The threshold is not particularly limited, and can be set, for example, in the range of 5 to 20%. In addition, the amount of the microcurrent is also not particularly limited, and can be set, for example, in the range of 0.01 C to 0.1 C.

Next operation will be described. The operation of the lithium secondary battery 2, the charge and discharge control portion 3, the measurement portion 4, the generation portion 5, the peak intensity ratio calculation portion 6, and the peak intensity ratio comparison portion 7 is similar to that of the first exemplary embodiment. In the second exemplary embodiment, when the occurrence of a nonuniform reaction state in the negative electrode 22 is sensed by the peak intensity comparison portion 7, the information transmission portion 8 transmits the information to the charge and discharge control portion 3, and the charge and discharge control portion executes a regeneration mode (charge and discharge with microcurrent, for example, 0.02 C).

EXAMPLES

Specific Examples will be described below.

Example 1

<Fabrication of Negative Electrode 22>

Silicon monoxide (average particle diameter D50=25 μm) manufactured by Kojundo Chemical Laboratory Co., Ltd., carbon black (trade name: #3030B, manufactured by Mitsubishi Chemical Corporation), and polyamic acid (trade name: U-Varnish A, manufactured by Ube Industries, Ltd.) were measured at a mass ratio of 83:2:15. They were mixed with n-methylpyrrolidone (NMP) using a homogenizer to provide a slurry. The mass ratio of the NMP and the solids was 57:43. The slurry was applied to 15 μm thick Cu0.2Sn using a doctor blade, and then heated at 120° C. for 7 minutes to dry the NMP to provide a negative electrode 22. Then, the negative electrode 22 was heated under a nitrogen atmosphere at 250° C. for 30 minutes using an electric furnace.

<Fabrication of Positive Electrode 21>

Lithium cobaltate manufactured by Nichia Corporation, carbon black (trade name: #3030B, manufactured by Mitsubishi Chemical Corporation), and polyvinylidene fluoride (trade name: #2400, manufactured by KUREHA CORPORATION) were measured at a mass ratio of 95:2:3. They were mixed with NMP to provide a slurry. The mass ratio of the NMP and the solids was 52:48. The slurry was applied to 15 μm thick aluminum foil using a doctor blade, and then heated and dried at 120° C. for 5 minutes.

<Fabrication of Lithium Secondary Battery 2>

An aluminum terminal and a nickel terminal were welded to the above positive electrode 21 and negative electrode 22, respectively. In addition, a nickel terminal was welded to copper foil and lithium foil bonded together (manufactured by Honjo Metal Co., Ltd.) to provide a lithium reference electrode (metal lithium reference electrode) 23. These were laminated via separators to fabricate an electrode element. The electrode element was packaged with a laminate film, and an electrolytic solution was injected. Then, while the pressure was reduced, the laminate film was heat-sealed for sealing to fabricate a flat plate type lithium secondary battery 2. For the separator, a polypropylene film was used. For the laminate film, an aluminum-deposited polypropylene film was used. For the electrolytic solution, a 7:3 (volume ratio) mixed solvent of ethylene carbonate and diethyl carbonate containing 1.0 mol/l of a $LiPF_6$ electrolyte salt was used.

<Evaluation of Lithium Secondary Battery 2>

The fabricated lithium secondary battery 2 was charged and discharged in the voltage range of 4.2 V to 2.7 V using the charge and discharge control portion 3 to perform a charge and discharge cycle test. The charge was performed by a CCCV method (constant current (1 C) to 4.2 V, and after 4.2 V was reached, the voltage was kept constant for 1 hour), and the discharge was performed by a CC method (constant current (1 C)). Here, the 1 C current means a current with such a magnitude that when a battery with any capacity is discharged with constant current, the discharge is completed in 1 hour. In the charge and discharge cycle test, a charge and discharge tester ACD-100M (trade name) manufactured by ASKA Electronic Co., Ltd. was used as the charge and discharge control portion 3.

While the charge and discharge cycle test was performed, simultaneously, the measurement portion 4 measured the voltage V between the negative electrode 22 and the lithium reference electrode (metal lithium reference electrode) 23, and calculated discharge capacity Q from discharge time and a discharge current value. The voltage V and the discharge capacity Q were recorded every 10 minutes or each time a change of 0.04 V occurred in voltage. The generation portion 5 drew a discharge curve from the voltage V and the discharge capacity Q, and obtained a V-dQ/dV curve from the obtained discharge curve.

The peak intensity ratio calculation portion 6 obtained the intensity of a peak at approximately 0.3 V and the intensity of a peak at approximately 0.5 V on the V-dQ/dV curve by approximation by a Gaussian function. When the ratio of the two peak intensities changed by ±10% or more from the initial value, the next charge and discharge cycle was set to be performed with a constant current of 0.02 C (regeneration mode).

Comparative Example 1

As Comparative Example 1, a battery fabricated as in Example 1 was similarly subjected to a charge and discharge cycle test except that no regeneration mode was performed.

Figure 4:
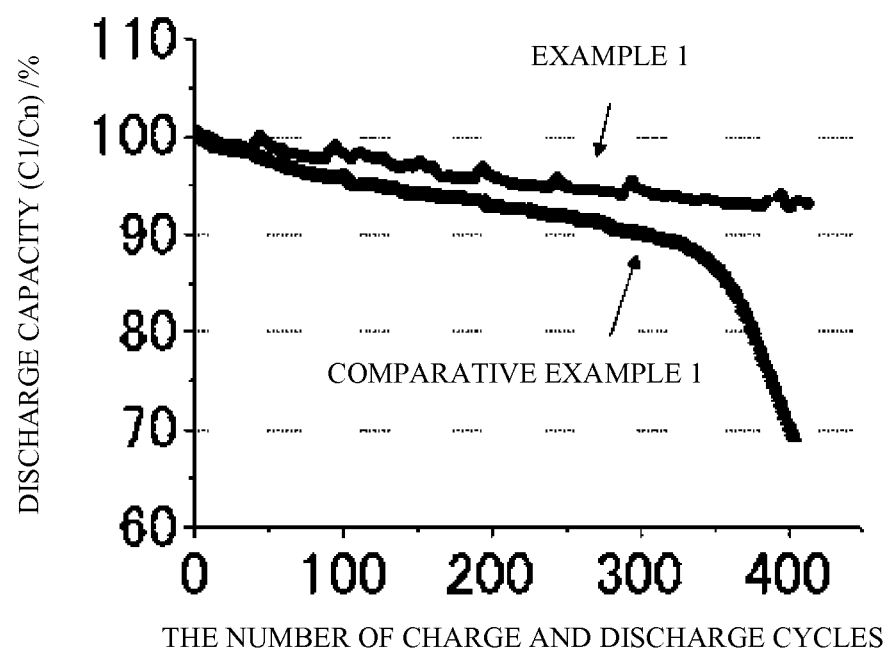
FIG. 4 is a diagram showing the relationship between capacity and the number of cycles for lithium secondary batteries.

FIG. 4 is a diagram showing the relationship between capacity and the number of cycles for the lithium secondary batteries 2 of Example 1 and Comparative Example 1. Referring to FIG. 4, it is found that in Comparative Example 1 in which no regeneration mode was performed, a decrease in capacity is seen in a smaller number of cycles than in Example 1. From FIG. 4, it is described that the present battery control system can sense the state of the negative electrode 22, and execute a regeneration mode as required, to reduce a decrease in the capacity of the lithium secondary battery 2 accompanying charge and discharge cycles.

Example 2

In this Example, the control system for a lithium secondary battery had structures similar to those of Example 1, but the threshold and the amount of current in the regeneration mode were different from those of Example 1. When the ratio of two peak intensities changed by not less than a threshold described in Table 1 from the initial value, the next charge and discharge cycle was executed with a constant current of 0.1 C (regeneration mode).

TABLE 1

| | Threshold (%) | Ratio of peak intensity ratio before regeneration mode to initial value (%) | Ratio of peak intensity ratio after regeneration mode to initial value (%) |
|---|---|---|---|
| Example 2-1 | 5 | 93.8 | 96.7 |
| Example 2-2 | 10 | 87.2 | 93.6 |
| Example 2-3 | 15 | 81.5 | 88.8 |
| Example 2-4 | 20 | 77.3 | 84.1 |

In addition, when the ratio of two peak intensities changed by 20% or more from the initial value, the next charge and discharge cycle was executed in the range of constant current described in Table 2.

TABLE 2

| | Current value (C) | Ratio of peak intensity ratio before regeneration mode to initial value (%) | Ratio of peak intensity ratio after regeneration mode to initial value (%) |
|---|---|---|---|
| Example 2-5 | 0.01 | 77.8 | 98.9 |
| Example 2-6 | 0.02 | 78.2 | 98.6 |
| Example 2-7 | 0.03 | 77.5 | 97.8 |
| Example 2-8 | 0.05 | 76.8 | 89.4 |
| Example 2-9 | 0.1 | 77.3 | 84.1 |

From Examples 2-1 to 2-4, it was confirmed that in the range in which the threshold was 5 to 20%, the deviation from the reference value of the peak intensity ratio returned to within the threshold after the execution of the regeneration mode. This is considered to be because the uniformity of lithium concentration was improved by the execution of the regeneration mode. In addition, also in the cases where the threshold was set to 20%, from Examples 2-5 to 2-9, it was confirmed that in the cases where the amount of current of the charge and discharge during the regeneration mode was 0.01 C to 0.1 C, the deviation from the reference value of the peak intensity ratio returned to within the threshold after the execution of the regeneration mode.

In the exemplary embodiments and the Examples described above, the illustrated structures or the calculation in the correction program is merely one example, and this exemplary embodiment is not limited thereto.

According to this exemplary embodiment, during the discharge of the lithium secondary battery 2 including the negative electrode 22 using silicon oxide as the negative electrode active material, the measurement portion 4 detects the voltage V of the negative electrode 22 with respect to the metal lithium reference electrode 23 and the discharge capacity Q of the lithium secondary battery 2, the generation portion 5 generates a V-dQ/dV curve, the peak intensity ratio calculation portion 6 calculates the intensity ratio of two peaks appearing on the V-dQ/dV curve, and the peak intensity ratio comparison portion 7 senses the state of the negative electrode 22 utilizing the intensity ratio.

In addition, in this exemplary embodiment, as the two voltage values, 0.3 V and 0.5 V are used.

In addition, in this exemplary embodiment, the charge and discharge control portion 3 repeatedly charges and discharges the lithium secondary battery 2, the measurement portion 4 measures the voltage V and the discharge capacity Q during the first discharge and during the second discharge respectively, the generation portion 5 generates a V-dQ/dV curve, each time the voltage V and the discharge capacity Q are measured, based on the measured voltage V and discharge capacity Q, the peak intensity ratio calculation portion 6 calculates, each time the V-dQ/dV curve is generated, the intensity ratio of two peaks appearing on the generated V-dQ/dV curve for the two voltage values, and the peak intensity ratio comparison portion 7 compares the intensity ratios each calculated during each discharge with each other, and senses the state of the negative electrode 22 from the result of the comparison.

In addition, in this exemplary embodiment, the peak intensity ratio comparison portion 7 senses that the degree of uniformity of lithium concentration in the negative electrode 22 becomes equal to or less than a predetermined value when the difference between the intensity ratio calculated based on the voltage V and the discharge capacity Q during the second discharge and the intensity ratio calculated based on the voltage V and the discharge capacity Q during the first discharge is equal to or more than a predetermined threshold (for example, ±10% in the example shown in FIG. 4). The threshold is not limited to ±10%, and can be appropriately changed, and may be, for example, ±20%.

The intensity ratio of two peaks appearing on the V-dQ/dV curve for the two voltage values changes according to the proportion of parts in which the lithium content is high to parts in which the lithium content is low in the negative electrode 22.

Therefore, the peak intensity ratio comparison portion 7 can sense the uniformity of the reaction in the negative electrode 22 of the lithium secondary battery 2 utilizing silicon oxide for the negative electrode active material, with good precision. In other words, from the intensity ratio of these two peaks, information regarding the proportion of parts in which the lithium content is high to parts in which the lithium content is low in the negative electrode 22 can be obtained.

The charge reaction of the negative electrode 22 having silicon oxide is basically due to a common mechanism based on a reaction in which silicon in silicon oxide and lithium form an alloy. Therefore, in all the lithium secondary batteries using silicon oxide as the active material of the negative electrode described above, the uniformity of the negative electrode reaction state can be quantified and sensed by the control system for a lithium secondary battery 1 in this exemplary embodiment.

This application claims priority to Japanese Patent Application No. 2010-175337 filed Aug. 4, 2010, and Japanese Patent Application No. 2010-287956 filed Dec. 24, 2010, the entire disclosure of which is incorporated herein.

While the invention of this application has been described with reference to the exemplary embodiments and the Examples, the invention of this application is not limited to the above exemplary embodiments and Examples. Various changes that can be understood by those skilled in the art can be made in the configuration and details of the invention of this application within the scope of the invention of this application.

REFERENCE SIGNS LIST 1 control system for lithium secondary battery
2 lithium secondary battery
21 positive electrode
22 negative electrode
23 lithium reference electrode
3 charge and discharge control portion
4 detection portion
41 voltage detection portion
42 current detection portion
43 discharge capacity calculation portion
5 generation portion
6 peak intensity ratio calculation portion
7 peak intensity ratio comparison portion
8 information transmission portion

The invention claimed is:

1. A control system for a lithium secondary battery comprising a positive electrode, a negative electrode using silicon oxide as a negative electrode active material, and means for obtaining a potential of the negative electrode with respect to a lithium reference electrode, the control system comprising:
measurement means for measuring a voltage V of the negative electrode with respect to the lithium reference electrode and a discharge capacity Q of the lithium secondary battery during discharge of the lithium secondary battery;

generation means for generating a V-dQ/dV curve representing a relationship between dQ/dV, which is a proportion of an amount of change dQ in the discharge capacity Q to an amount of change dV in the voltage V, and the voltage V;

calculation means for calculating an intensity ratio of two peaks appearing on the V-dQ/dV curve for two voltage values in the voltage V; and sensing means for sensing a state of the negative electrode utilizing the intensity ratio.

2. The control system for a lithium secondary battery according to claim 1, wherein
the two voltage values are redox potentials of the silicon oxide.

3. The control system for a lithium secondary battery according to claim 1, wherein
the two voltage values are approximately 0.3 V and approximately 0.5 V.

4. The control system for a lithium secondary battery according to claim 1, further comprising:
charge and discharge control means for repeatedly charging and discharging the lithium secondary battery, wherein
the measurement means measures the voltage V and the discharge capacity Q during first discharge and during second discharge performed after the first discharge respectively,
the generation means generates the V-dQ/dV curve, each time the voltage V and the discharge capacity Q are measured, based on the voltage V and the discharge capacity Q,
the calculation means calculates, each time the V-dQ/dV curve is generated, an intensity ratio of two peaks appearing on the V-dQ/dV curve for the two voltage values, and
the sensing means compares the intensity ratios calculated by the calculation means with each other, and senses the state of the negative electrode from a result of the comparison.

5. The control system for a lithium secondary battery according to claim 4, wherein
the sensing means senses that a degree of uniformity of lithium concentration in the negative electrode becomes equal to or less than a predetermined value when a difference between the intensity ratio calculated based on the voltage V and the discharge capacity Q during the second discharge and the intensity ratio calculated based on the voltage V and the discharge capacity Q during the first discharge is equal to or more than a predetermined threshold.

6. The control system for a lithium secondary battery according to claim 5, wherein
the sensing means further comprises information transmission means for transmitting, when the sensing means senses that the difference between the intensity ratio calculated based on the voltage V and the discharge capacity Q during the second discharge and the intensity ratio calculated based on the voltage V and the discharge capacity Q during the first discharge becomes equal to or more than a predetermined threshold, the information to the charge and discharge control means, and
the charge and discharge control means receiving the transmission executes means for improving the degree of uniformity of the lithium concentration in the negative electrode.

7. The control system for a lithium secondary battery according to claim 5, wherein
the predetermined threshold is 5 to 20%.

8. The control system for a lithium secondary battery according to claim 7, wherein
the means for improving the degree of uniformity of the lithium concentration in the negative electrode is charge and discharge with microcurrent.

9. The control system for a lithium secondary battery according to claim 8, wherein
an amount of the microcurrent is 0.01 C to 0.1 C.

10. A lithium secondary battery comprising a positive electrode, a negative electrode using silicon oxide as a negative electrode active material, and a lithium reference electrode having a reference potential with respect to the negative electrode, the lithium secondary battery comprising:
a charge and discharge control portion for repeatedly charging and discharging the lithium secondary battery;
a measurement portion for measuring a voltage V of the negative electrode with respect to the lithium reference electrode and a discharge capacity Q of the lithium secondary battery during discharge of the lithium secondary battery;
a generation portion for generating a V-dQ/dV curve representing a relationship between dQ/dV, which is a proportion of an amount of change dQ in the discharge capacity Q to an amount of change dV in the voltage V, and the voltage V;
a peak intensity ratio calculation portion for calculating an intensity ratio of two peaks appearing on the V-dQ/dV curve for two voltage values in the voltage V;
a peak intensity ratio comparison portion for sensing a state of the negative electrode utilizing the intensity ratio; and
an information transmission portion for transmitting, when the comparison portion senses that a difference between the intensity ratio of the two peaks appearing on the V-dQ/dV curve for the two voltage values in the voltage V becomes equal to or more than a predetermined threshold, the information to the charge and discharge control portion, wherein
the charge and discharge control portion receiving the transmission executes means for improving a degree of uniformity of lithium concentration in the negative electrode.

11. The lithium secondary battery according to claim 10, wherein
the two voltage values are redox potentials of the silicon oxide.

12. The lithium secondary battery according to claim 10, wherein
the two voltage values are approximately 0.3 V and approximately 0.5 V.

13. The lithium secondary battery according to claim 10, wherein
the measurement portion measures the voltage V and the discharge capacity Q during first discharge and during second discharge performed after the first discharge respectively,
the generation portion generates the V-dQ/dV curve, each time the voltage V and the discharge capacity Q are measured, based on the voltage V and the discharge capacity Q,
the peak intensity ratio calculation portion calculates, each time the V-dQ/dV curve is generated, an intensity ratio of two peaks appearing on the V-dQ/dV curve for the two voltage values, and the peak intensity ratio comparison portion compares the intensity ratios calculated by the calculation portion with each other, and senses the state of the negative electrode from a result of the comparison.

14. The lithium secondary battery according to claim 13, wherein
the comparison portion senses that the degree of uniformity of the lithium concentration in the negative electrode becomes equal to or less than a predetermined value when a difference between the intensity ratio calculated based on the voltage V and the discharge capacity Q during the second discharge and the intensity ratio calculated based on the voltage V and the discharge capacity Q during the first discharge is equal to or more than a predetermined threshold.

15. The lithium secondary battery according to claim 14, wherein
the predetermined threshold is 5 to 20%.

16. The lithium secondary battery according to claim 15, wherein
the charge and discharge control portion receiving the transmission performs charge and discharge with microcurrent.

17. The lithium secondary battery according to claim 16, wherein
an amount of the microcurrent is 0.01 C. to 0.1 C.

18. A method for detecting a state of a lithium secondary battery comprising a positive electrode, a negative electrode using silicon oxide as a negative electrode active material, and a lithium reference electrode having a reference potential with respect to the negative electrode, the method comprising:
a measurement step of measuring a voltage V of the negative electrode with respect to the lithium reference electrode and a discharge capacity Q of the lithium secondary battery during discharge of the lithium secondary battery;
a generation step of generating a V-dQ/dV curve representing a relationship between dQ/dV, which is a proportion of an amount of change dQ in the discharge capacity Q to an amount of change dV in the voltage V, and the voltage V;
a calculation step of calculating an intensity ratio of two peaks appearing on the V-dQ/dV curve for two voltage values in the voltage V; and
a sensing step of sensing a state of the negative electrode utilizing the intensity ratio.

19. The method for detecting a state of a lithium secondary battery according to claim 18, wherein
the two voltage values are redox potentials of the silicon oxide.

20. The method for detecting a state of a lithium secondary battery according to claim 18, wherein
the two voltage values are approximately 0.3 V and approximately 0.5 V.

* * * * *